United States Patent
Benoit

(10) Patent No.: US 9,746,203 B2
(45) Date of Patent: Aug. 29, 2017

(54) ELECTRIC RADIATOR USING CALCULATING PROCESSORS AS A HEAT SOURCE

(71) Applicant: QARNOT COMPUTING, Paris (FR)

(72) Inventor: Paul Benoit, Paris (FR)

(73) Assignee: QARNOT COMPUTING, Paris (FR)

( * ) Notice: Subject to any disclaimer, the term of this patent is extended or adjusted under 35 U.S.C. 154(b) by 0 days.

(21) Appl. No.: 14/623,237

(22) Filed: Feb. 16, 2015

(65) Prior Publication Data
US 2015/0160704 A1    Jun. 11, 2015

Related U.S. Application Data

(63) Continuation of application No. 13/520,606, filed as application No. PCT/FR2010/052788 on Dec. 17, 2010, now Pat. No. 9,151,515.

(30) Foreign Application Priority Data

Jan. 6, 2010 (FR) .................................... 10 50056

(51) Int. Cl.
*H05K 7/20* (2006.01)
*F24H 3/06* (2006.01)
(Continued)

(52) U.S. Cl.
CPC ............... *F24H 3/062* (2013.01); *F28F 7/00* (2013.01); *G06F 1/20* (2013.01); *G06F 1/206* (2013.01);
(Continued)

(58) Field of Classification Search
CPC .. H05K 7/20; H05K 7/20263; H05K 7/20272; G06F 1/20; G06F 1/206; H01L 23/473; F24H 3/062; F28F 7/00; F24D 2200/29
USPC ...... 361/679.46–679.55, 688–699, 704–715, 361/719–724; 165/80.2–80.5, 104.19, 165/104.33, 104.34, 185, 121–126; 174/15.1, 16.3, 50.52, 520; 257/713–718,
(Continued)

(56) References Cited

U.S. PATENT DOCUMENTS 5,058,389 A    10/1991  Yasuda et al.
5,349,498 A    9/1994   Tanzer et al.
(Continued)

FOREIGN PATENT DOCUMENTS

CN    1589094 A      3/2005
CN    201035489 Y    3/2008
(Continued)

*Primary Examiner* — Courtney Smith
(74) *Attorney, Agent, or Firm* — Greer, Burns & Crain, Ltd.

(57) ABSTRACT

An electric radiator is provided using calculating processors as a heat source and includes a heating body where the heat transfer between the heat source and the ambient air takes place; a number of processors distributed over a number of printed circuit boards forming the heat source of the radiator and a power resource carrying out calculations by external computer systems; a man-machine interface enabling the control of the calculating and calorific power supplied by the radiator; a power source stabilized for the different electrical components; and a network interface for connecting the radiator to the external networks.

8 Claims, 7 Drawing Sheets

(51) Int. Cl.
  *F28F 7/00* (2006.01)
  *G06F 1/20* (2006.01)

(52) U.S. Cl.
  CPC ........... *H05K 7/20* (2013.01); *H05K 7/20263* (2013.01); *H05K 7/20272* (2013.01); *F24D 2200/29* (2013.01); *G06F 2200/201* (2013.01)

(58) Field of Classification Search
  USPC ...... 257/721–726; 62/259.2, 238.6; 454/184; 312/223.2, 236, 265; 700/299, 300, 301
  See application file for complete search history.

(56) References Cited

U.S. PATENT DOCUMENTS

| | | | |
|---|---|---|---|
| 5,676,198 A | 10/1997 | Schneider et al. | |
| 6,055,154 A | 4/2000 | Azar | |
| 6,101,090 A * | 8/2000 | Gates | H05K 7/20136 165/104.33 |
| 6,141,219 A | 10/2000 | Downing et al. | |
| 6,255,622 B1 | 7/2001 | May et al. | |
| 6,305,463 B1 | 10/2001 | Salmonson | |
| 6,336,080 B1 | 1/2002 | Atkinson | |
| 6,434,000 B1 * | 8/2002 | Pandolfi | F25B 21/02 136/204 |
| 6,504,719 B2 | 1/2003 | Konstad et al. | |
| 6,778,393 B2 | 8/2004 | Messina et al. | |
| 6,885,555 B2 | 4/2005 | Greco | |
| 6,992,887 B2 | 1/2006 | Jairazbhoy et al. | |
| 7,095,611 B2 * | 8/2006 | Kunz | G06F 1/181 165/185 |
| 7,099,153 B2 | 8/2006 | Yazawa | |
| 7,180,747 B2 | 2/2007 | Lee | |
| 7,360,945 B2 | 4/2008 | Kardach et al. | |
| 7,370,242 B2 | 5/2008 | Chen et al. | |
| 7,385,821 B1 | 6/2008 | Feierbach | |
| 7,436,660 B2 * | 10/2008 | Pedoeem | H04L 12/18 165/80.3 |
| 7,480,140 B2 * | 1/2009 | Hara | H05K 7/20145 312/223.2 |
| 7,523,317 B2 | 4/2009 | Oswald et al. | |
| 7,551,440 B2 | 6/2009 | Belady et al. | |
| 7,633,751 B2 * | 12/2009 | Shinotou | H05K 7/20972 349/58 |
| 7,808,780 B2 | 10/2010 | Brunschwiler et al. | |
| 7,859,843 B2 | 12/2010 | Chuang | |
| 7,904,074 B2 | 3/2011 | Karaoguz et al. | |
| 7,929,302 B2 | 4/2011 | Chuang | |
| 8,009,435 B2 * | 8/2011 | Metzger | H05K 7/1429 361/704 |
| 8,059,401 B2 | 11/2011 | Guan | |
| 8,548,640 B2 | 10/2013 | Belady et al. | |
| 8,593,812 B2 | 11/2013 | Morino et al. | |
| 8,755,948 B2 | 6/2014 | Bower et al. | |
| 2002/0105779 A1 | 8/2002 | Lei | |
| 2003/0138325 A1 | 7/2003 | Su | |
| 2003/0220721 A1 | 11/2003 | Cohen | |
| 2005/0006085 A1 | 1/2005 | Nelson | |
| 2005/0049729 A1 | 3/2005 | Culbert et al. | |
| 2005/0178133 A1 | 8/2005 | Henry et al. | |
| 2005/0219814 A1 * | 10/2005 | Yazawa | H05K 7/20445 361/692 |
| 2005/0289372 A1 | 12/2005 | Park | |
| 2006/0120038 A1 | 6/2006 | Lucero et al. | |
| 2006/0178785 A1 | 8/2006 | Chang | |
| 2006/0193114 A1 | 8/2006 | Faneuf et al. | |
| 2007/0227708 A1 | 10/2007 | Hom et al. | |
| 2008/0228865 A1 | 9/2008 | Cruzada | |
| 2009/0114370 A1 | 5/2009 | Konig | |
| 2010/0122174 A1 | 5/2010 | Snibbe et al. | |
| 2011/0082601 A1 | 4/2011 | Pulley | |
| 2011/0096503 A1 | 4/2011 | Avery et al. | |
| 2012/0123595 A1 | 5/2012 | Bower et al. | |

FOREIGN PATENT DOCUMENTS

| | | |
|---|---|---|
| EP | 1564627 | 8/2005 |
| JP | 2001253306 A | 9/2001 |
| WO | 2009107015 | 3/2009 |
| WO | 2009/156649 | 12/2009 |

* cited by examiner

)
ELECTRIC RADIATOR USING CALCULATING PROCESSORS AS A HEAT SOURCE

PRIORITY CLAIM

This application is a continuation application of and claims the benefit of U.S. patent application Ser. No. 13/520,606 filed on Jul. 5, 2012, which is incorporated herein in its entirety.

FIELD OF THE INVENTION

This invention relates to the field of electric heating. More specifically, it relates to an electric radiator for heating home or business premises.

BACKGROUND

Among the types of heating of homes or business premises, is known the electric heating. Widely used, electric heating generally uses electric radiators located in the different rooms to be heated. Each radiator is connected to the electric network to power one or more electric resistors used as a heat source.

To diffuse heat in the room, there are several types of radiator. Heat produced by the heat source can be directly transmitted to ambient air, in the case of a convector, or through one or several bodies. Heat transfer between each body is made by a combination of conduction, convection and radiation effects. In the case of convection, this can be natural or forced. Thus, the heat source can transmit heat produced to a fluid the flow of which is natural or forced in the body of the radiator, the latter transferring heat to ambient air through its external surface.

For increasingly growing requirements of computer services, computer servers are used. These are computers the main object of which is to respond, via a computer network, to computer processing requests from multiple users, called clients. These servers, once configured, do not require any physical interaction with final users. They thus can be located in remote hosting centres, called Datacenters, which ensure their operation and accessibility via the network.

Data processing by a computer server is mainly performed by one or more processors. There are generic processors called central processing unit (CPU) and specialized processors, in particular for graphics calculations ("graphics processing unit" or GPU). By executing instructions provided thereto, the processor consumes electrical energy and discharges heat. Like the electric resistor, most of the energy consumed by the processor is discharged as heat. This amount of heat depends on technical characteristics of the processor and the rate at which it is intended to execute instructions. This rate is generally adjusted as a function of the capacity available to remove the heat produced. In fact, beyond a certain temperature, the processor has decreasing heat performances and above all, it may stop operating. A Datacenter has to provide for the removal of this heat in order to ensure the operation of servers hosted thereby. This removal is made by air conditioning of hosting rooms or, more directly, server storage cabinets. This air conditioning need is all the more important as the server concentration is important in the Datacenter.

One object of the present invention is to provide a heating system using heat produced by computing resources. Another object of the invention is an efficient and simplified transfer of this heat.

SUMMARY

The invention relates to an electric radiator which can be used for heating homes or business premises and using calculating processors as a heat source. The radiator can be used for its heat generating capacity and/or calculating capacity.

According to the invention, the single electric radiator comprises an internal heat source and a heating body for performing heat transfer between the heat source of the electric radiator and ambient air. Advantageously, the heat source is formed by at least one processing circuit whereon at least one computing processor is provided, the latter being connected to a dissipating block to remove heat in the heating body. This electric radiator further comprises a control interface for controlling the amount of energy dissipated by the heat source, a power supply and a communication interface enabling an external computer system to access said at least one processor as a computing resource.

With the radiator according to the invention, the processor is used as a heat source and a computing resource for remote machines.

The control interface is driven by the user. Depending on the user's setpoint, this control interface controls the processors so as to obtain an amount of dissipated energy meeting this setpoint. For example, if the user demands more heat, the control interface can order to one or several processors to execute predetermined calculations or algorithms, each calculation or algorithm being quantized in terms of dissipated energy. If the user demands less heat, fewer processors are used or fewer calculations are executed. When the processor(s) is (are) used by an external computer system, the control interface takes this use into account to meet the user's setpoint. The control interface can be configured so as to transmit to the external computer system a signal representing the computing resource available in the radiator depending on a user's setpoint. Thus, the processors of the radiator execute calculations (ordered by the external computer system) which are sufficient in number and/or in complexity to provide the amount of calorific energy required by the user. If these calculations are insufficient, the control interface completes them with predetermined calculations which are specially stored internally.

In other words, the radiator can be formed by:
a heating body at which a heat transfer between the heat source and the ambient air is performed, including a number N of channels, where N is equal to 0, 1 or higher. When N is non-zero, the channel(s) is (are) travelled by a heat transfer fluid enabling the heat transfer to be increased;
a number Q of interconnected processors distributed on a number P of printed circuit boards, called modules, forming the heat source of the radiator and a computing power resource;
a human-machine interface enabling the control of the calculating and calorific power supplied by the radiator;
a network interface for connecting the computing resource of the radiator to external networks;
a controlled power supply to power the different modules.

The heating body can be of different types depending on the number Q of processors and the total calorific power W they supply. It can be passive air cooling for a restricted power, cooling through heat transfer fluid natural flow for a medium power or through forced flow by an electrical pump integrated to the radiator for a high power.

The heat transfer fluid can come from a circuit external to the radiator.

The Q processors are distributed on a number P of printed circuit boards which can be compared to single or multi-processor mother boards called modules. All the P printed circuit boards form one or several computer processing units. The radiator provides a heat exchange physical interface through dissipating blocks for the different electrical components of the processing units, in particular the processors, but also the other components discharging heat: chipset, random access memories, mass memories, power supply. The geometry of this exchange surface is parameterized depending on heat removal needs of the modules and heat removal capacity of the radiator. The modules are characterised by a physical architecture adapted to this heat exchange interface. To optimize use of the surface of the modules, components which do not need any particular cooling device as well as potentially bulky components relative to the geometry of the dissipating block(s) could be provided on the back face of the modules.

A control human-machine interface is present on the radiator for:
  switching on/off the radiator
  setting the electrical power of the radiator
  viewing the actual consumption of the radiator
  viewing synthetic information about use of the computing power of the radiator.

The modules are interconnected and have available a network interface centralized with the external network in order to feed the radiator with calculations to be performed and to enable the radiator to communicate results of the calculations carried out.

According to an advantageous characteristic of the invention, the control interface is configured so as to transmit to the external computer system a signal representing the computing resource available in the radiator, this availability depending on a setpoint from a user.

The stabilized current power supply provides a power adapted to the consumption of the different modules. It is adapted in particular to the number and power of the active modules for calculating and generating heat. Power dissipated as heat by the power supply is also transferred to the radiator by the same interface type as the modules.

Advantageously, the radiator can provide connection interfaces other than the mere network interface. These can be video, audio, series, parallel interfaces allowing a use of the radiator being comparable to that of a microcomputer, a multimedia box or a video game console by connecting external peripherals (screen, keyboard, remote controller, joysticks, audio speakers).

Preferably, the processing circuit is provided outside the heating body, part of the dissipating block directly contacting the heating body and its possible heat transfer fluid through a wall of the heating body.

According to another aspect of the invention, it is provided a heating system comprising:
  a plurality of single remote electric radiators, each radiator comprising an internal heat source and a heating body for performing heat transfer between the heat source of the electric radiator and ambient air, characterised in that the heat source is formed by at least one processing circuit whereon at least one computing processor is provided therein, the latter being connected to a dissipating block to remove heat in the heating body; and in that it comprises a control interface for controlling the amount of energy dissipated by the heat source, a power supply and a communication interface enabling an external computer system to access said at least one processor as a computing resource,
  at least one remote server connected to all the single electric radiators via an Internet type communication network so as to use the computing resource available in every single electric radiator.

The radiator according to the invention makes heat created by the processor immediately available in the room where the processor is located. On the contrary, in Datacenter type computer systems according to prior art where numerous servers are concentrated in a single room, it is attempted to remove this heat towards the outside. This removal is costly in energy and financial means because it requires numerous fans or pumps and an often complex removal circuit. The present invention results from a different reasoning: the computing resource is distributed and heat generated by the processor is directly used on the generation place. Heat generation is individualized.

The system according to the invention ensures the quality of computer services because it can be made in accordance with grid computing.

A grid computing is supported by a set of computer resources which are potentially:
  shared: they are made available to different consumers of the grid and possibly for different applicative uses;
  distributed: to be quicker, a single service can use simultaneously several resources;
  heterogeneous: they are of any nature, for example differing by the technical characteristics or the operating system;
  coordinated: they are organized, connected and managed depending on needs and constraints by software agents, centralized or distributed, for coordination;
  autonomous: they are not necessarily controlled by a common unit;
  delocalized: they can belong to several sites, organizations, networks and be located at different geographical places.

This type of physical and software architecture allows to follow, overcome and remedy localized service shutdowns by being supported by other resources of the grid. As far as the resources are concerned, the computing grid is mainly made up of a set of servers interconnected through Internet or a local area network.

Of course, different characteristics, forms and alternative embodiments of the invention can be associated with each other according to various combinations in so far as they are not be incompatible or exclusives of each other.

BRIEF DESCRIPTION OF THE DRAWINGS

The manner in which the invention can be embodied and the advantages resulting therefrom will be better understood from the exemplary embodiment which follows, given as an illustrating and non-limiting way, in support of the appended figures.

DETAILED DESCRIPTION

In the figures, different elements common to various alternatives or embodiments have the same references.

Figure 1:
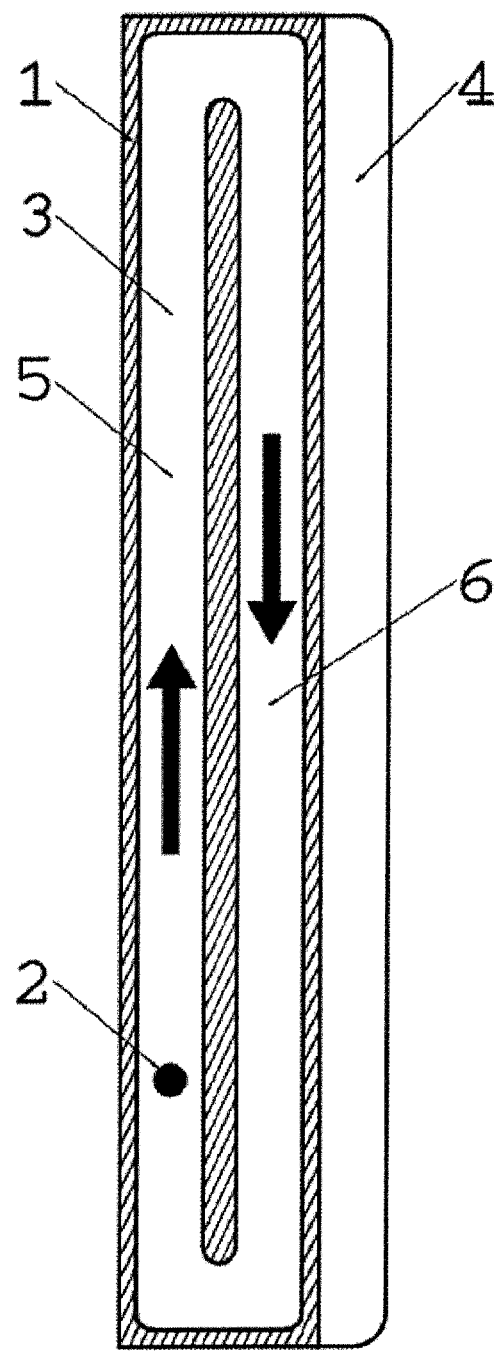
FIG. 1 is a schematic representation of the transverse cross-section view of an electric radiator according to prior art using a heat transfer fluid flow and an electric resistor as a hot source.

In connection with FIG. 1 according to prior art, is represented the schematic operation of an electric radiator, known per se, using the heat transfer fluid flow and an electric resistor as a heat source. This radiator is mainly formed by a possibly modular heating body 1 and a heating electric resistor 2 inserted in the heating body and passing through it substantially along the entire length thereof Within the heating body, flows a heat transfer fluid 3 the nature of which is adapted to the heat function contemplated. The positioning of the resistor depends on the resistor power, the heat transfer fluid nature and the heating body geometry.

The heating body 1 can, for example, be made of cast aluminium and, in order to optimize heat transfer with ambient air, is likely to have fins 4 promoting heat transfer within the room wherein such a radiator is implanted.

Heat generated by the heat source is transmitted to the heat transfer fluid which smoothly and naturally flows in the circuit of the heating body thanks to the temperature gradient between the heat source area of the upward channel 5 and the heat transmission area to the outside of the downward channel 6.

Figure 2:
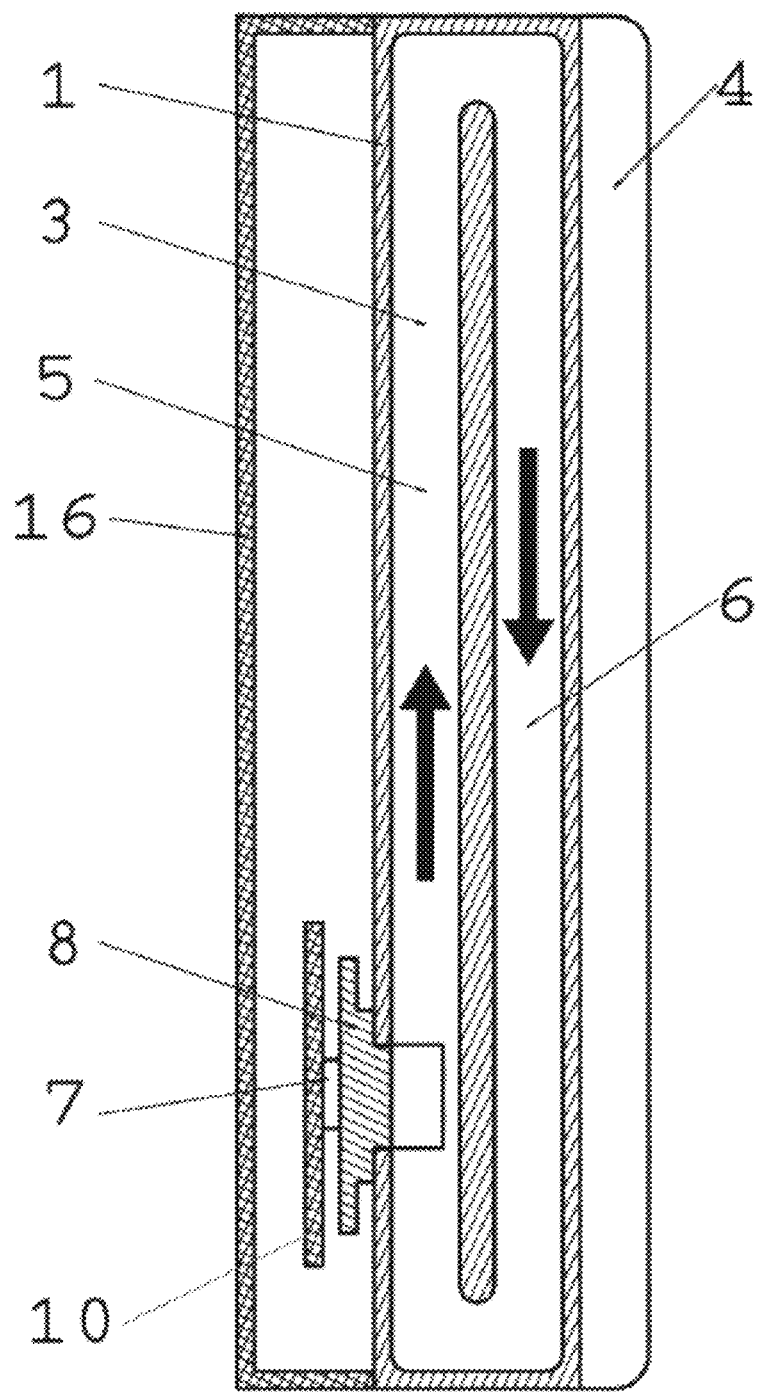
FIG. 2 is a transverse cross-section view of a radiator in accordance with the invention.

In FIG. 2 according to the invention, use of processors 7 as a heat source as a replacement of the electric resistor 2 is illustrated. The processors are located outside the heating body and transmit heat to the heat transfer fluid through a dissipating block 8 having a high heat conductivity to the heat transfer fluid located inside the heating body. The dissipating block 8 is a solid block made of copper or aluminium or any other material having calorific properties suitable for removing heat. The geometry of the block 8 is characterised by a planar and smooth surface 9 at the interface with the processors and a surface optimized for heat transfer with the fluid 3 inside the heating body 1. The contact between the heating body 1 and the block 8 is hermetic to the heat transfer fluid 3.

Figure 3:
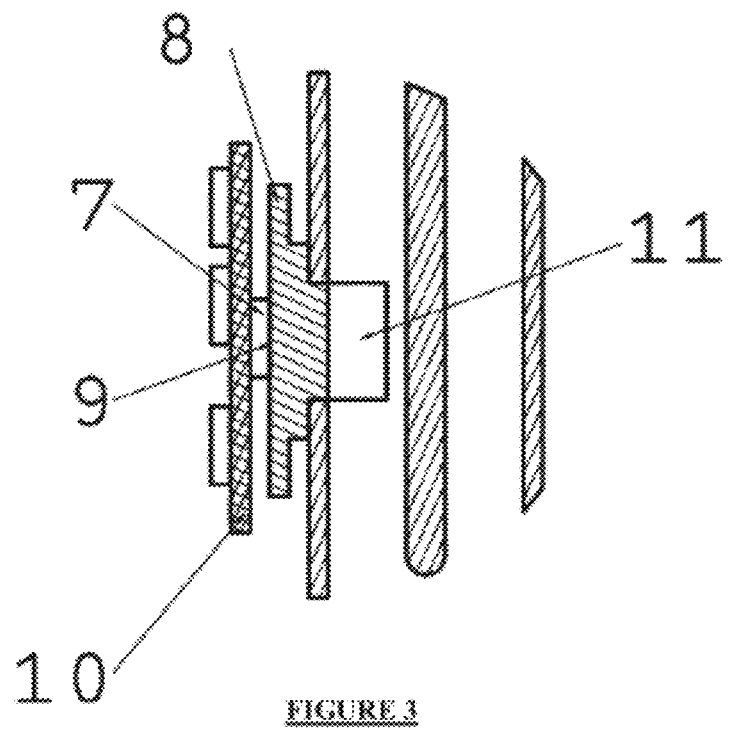
FIG. 3 is a detailed schematic representation of the transverse cross-section view of the lower area of the radiator according to the invention.

In FIG. 3, is detailed the lower part of the radiator of FIG. 2, in particular the interface between a processing circuit 10 and a dissipating block 8. The components requiring a heat removal are plated unto the external surface of the block 8.

Figure 4:
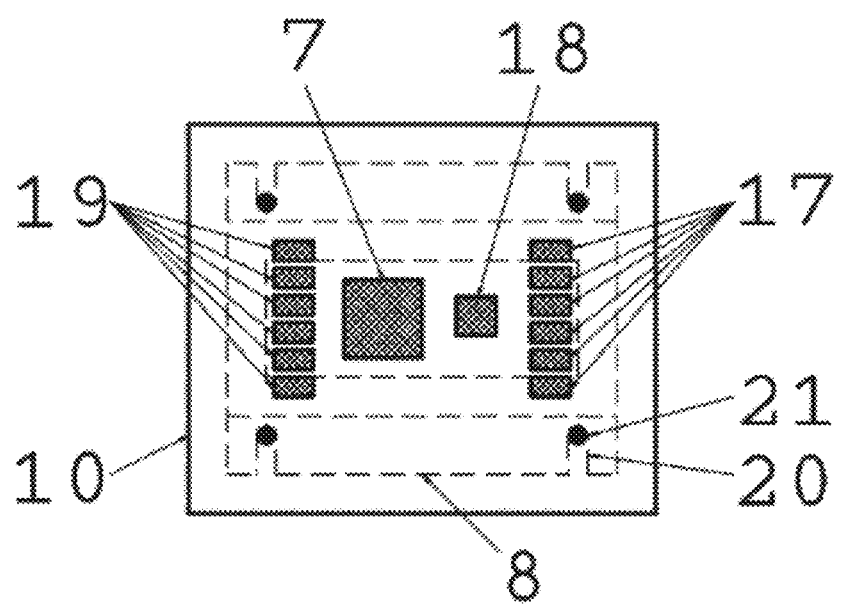
FIG. 4 is a schematic representation of the arrangement of electronic components of the modules on the heat transfer interface.

In FIG. 4, is illustrated an arrangement of electronic components (processor 7, chipset 18, random access memory 17, mass memory 19) on a processing circuit and the contacting with a dissipating block 8. Depending on the density of the components, the heat exchange interface is either one-block, or comprised of several blocks. Just as a dissipating block can be contacting components of several processing circuits, a processing circuit can be "astride" on several dissipating blocks. By way of illustration, the device 20 for fastening a processing circuit 10 to a block 8 through fastening screws 21 is presented.

Figure 5:
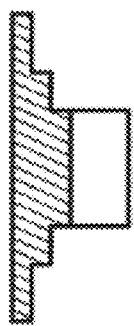
FIGS. 5, 6 and 7 are detailed schematic representations of the dissipating block in a profile, top and face view respectively.
Figure 6:
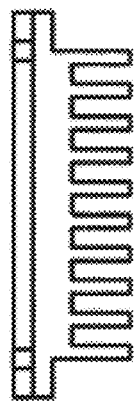
Figure 7:
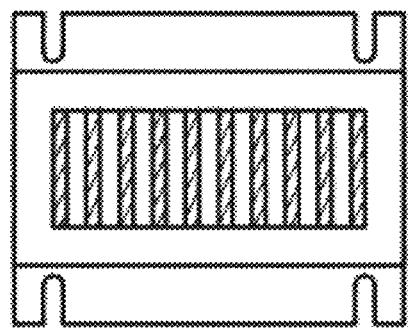

In FIGS. 5, 6 and 7 are illustrated different views of the dissipating block 8.

Figure 8:
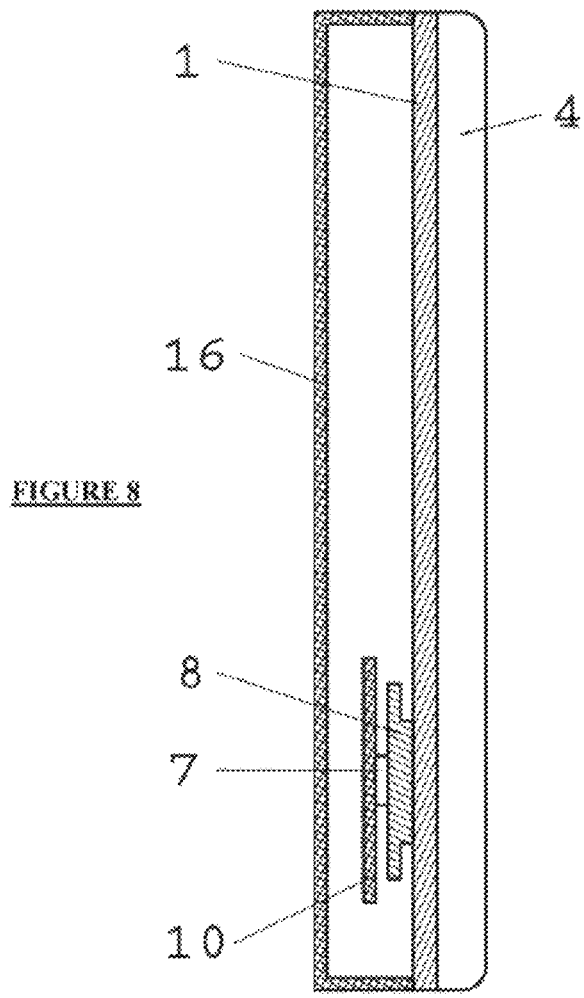
FIG. 8 is an illustration of an alternative radiator according to the invention not using a heat transfer fluid.

In FIG. 8, an alternative of the invention is illustrated, which does not use a heat transfer fluid.

Figure 9:
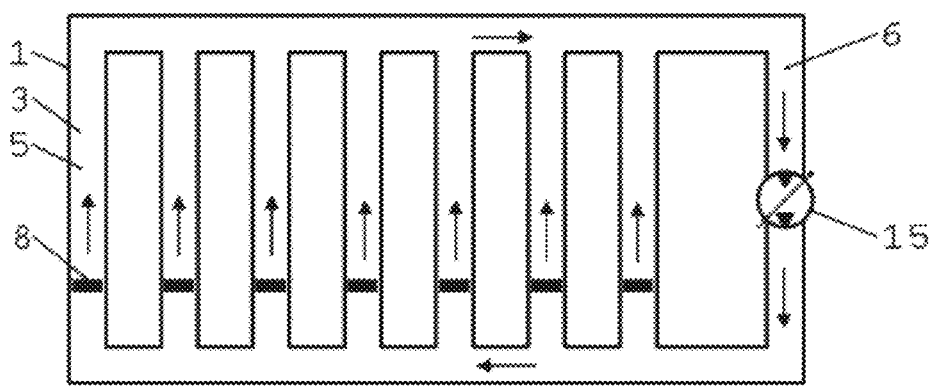
FIG. 9 is an illustration of an alternative radiator according to the invention using a heat transfer fluid and a forced flow device.

In FIG. 9 is given the operating scheme of an alternative of the invention using a heat transfer fluid and a forced flow device via a pump 15. The device is unchanged at the dissipating blocks. Only the heating body 1 is modified to allow a forced cooling circuit via a pump 15. This flow type can be compared to that of conventional forced fluid flow radiators. The pump 15 is not necessarily integrated to the radiator and several radiators in accordance with the invention can be connected in series to the same heat transfer fluid 3. This circuit can also integrate conventional radiators. Such a device is useful in that it enables heat to be removed towards the outside of the building when it is mostly desired to use the computing power of the radiators in accordance with the invention while restricting the heat generated within rooms wherein they are implanted.

Figure 10:
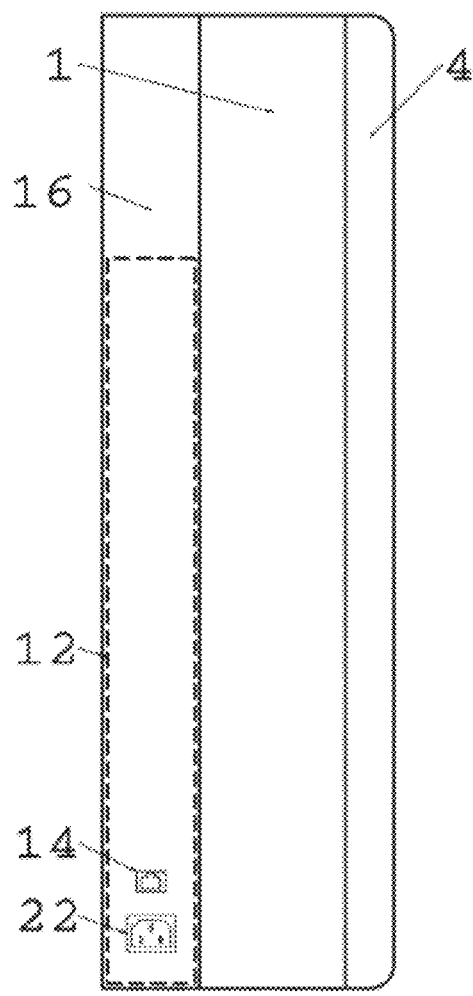
FIGS. 10 and 11 are schematic representations of a radiator in accordance with the invention in an external, profile and top view, respectively.
Figure 11:
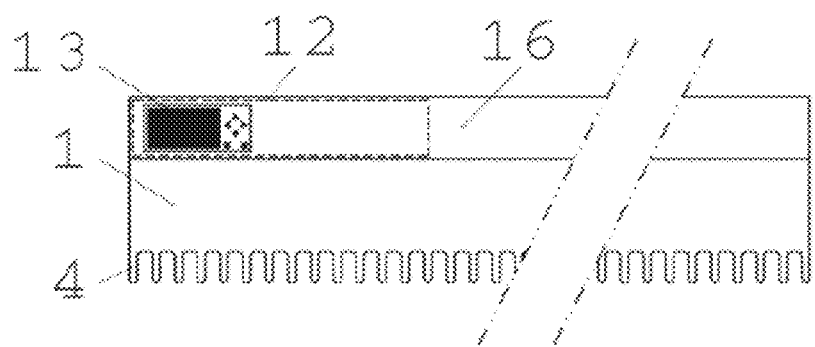

In FIGS. 10 and 11 are illustrated outside views of a radiator in accordance with the invention as a whole. It enables the human-machine interface 13, power supply cable socket 22 and network interface 14 to be illustrated. It also enables the position of the power supply block 12 to be illustrated inside the back protective cover 16.

Figure 12:
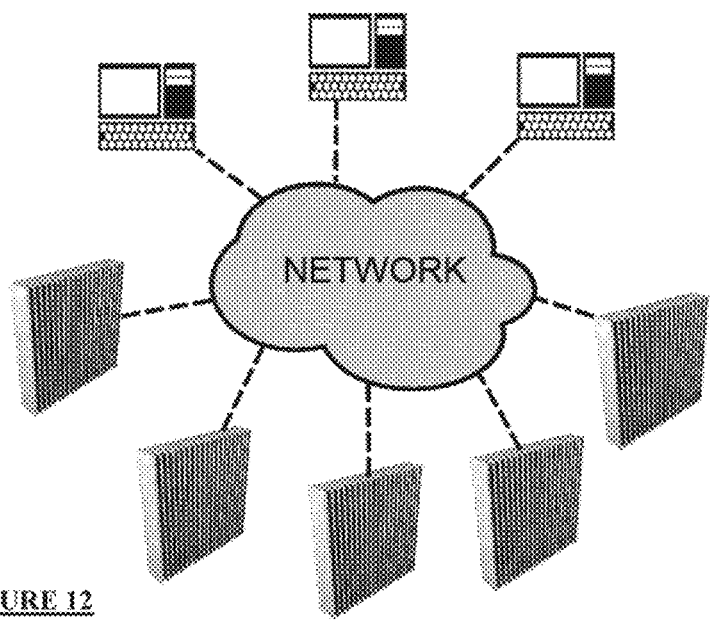
FIG. 12 describes a system according to the invention comprising a set of radiators according to the invention and its users connected to each other via a computer network.

In FIG. 12 is described a system according to the invention comprising a set of radiators according to the invention and remote users connected to each other via a computer network. The grid computing type software architecture allows the computing resource provided by the radiator stock according to the invention to be followed, organized and used.

Figure 13:
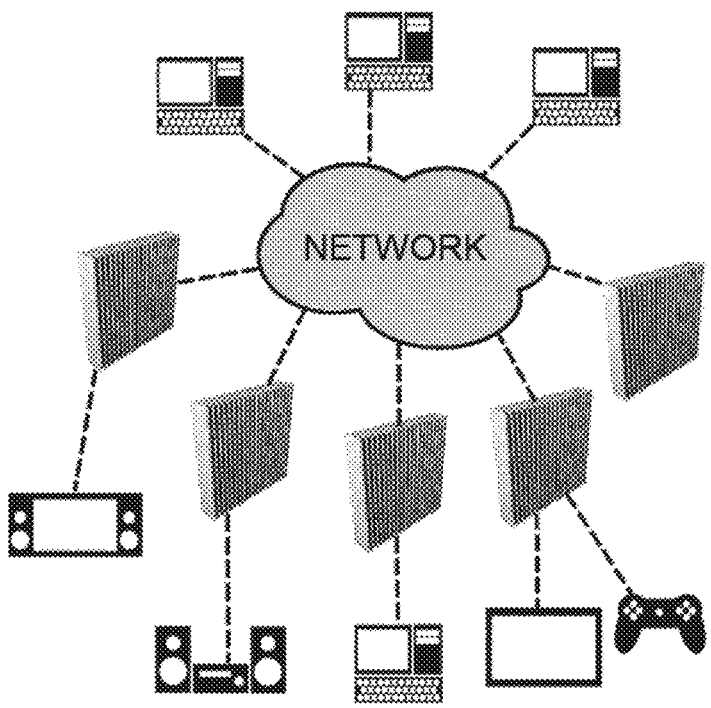
FIG. 13 illustrates the potential use of single radiators as microcomputer, multimedia box, video game console or as an extension of such a system by connecting external peripherals (screen, keyboard, remote controller, joysticks, speakers, audio).

In FIG. 13 is illustrated the potential use of single radiators such as a microcomputer, multimedia box, video game console or as an extension of such a system by connecting external peripherals (screen, keyboard, remote controllers, joysticks, speakers, audio). The radiators according to the invention then have connecting interfaces adapted to the peripheral contemplated (VGA, Series, Parallel, PS2, Bluetooth, WIFI, HDMI, RCA, . . . )

Of course, the invention is not restricted to the examples just described and numerous alterations can be made to these examples without departing from the scope of the invention.

What is claimed is:

1. A single electric radiator comprising an internal heat source and a heating body for performing heat transfer between the heat source of the single electric radiator and ambient air of the single electric radiator;

the heat source is formed by at least one processing circuit whereon at least one computer processor is provided, the at least one computer processor being connected to a dissipating block for evacuating heat in the heating body;

a user control interface in communication with the heat source and configured for controlling the amount of energy dissipated by the heat source by controlling the at least one computer processor and the calculations executed by the at least one computer processor to obtain the amount of dissipated energy based on a user's setpoint, the user control interface is configured to transmit to an external computer system, a signal representing a computing resource available in the radiator depending on the user's setpoint, said at least one computer processor executing calculations ordered by the external computer system which are sufficient in number and/or in complexity to provide the amount of calorific energy required by the user, a power supply and a communication interface enabling the external computer system to access said at least one computer processor.

2. The radiator according to claim 1, further comprising a naturally flowing heat transfer fluid that travels in the heating body.

3. The radiator according to claim 1, further comprising a heat transfer fluid that travels in the heating body, in a forced way by an electric pump integrated to the radiator.

4. The radiator according to claim 1, further comprising a heat transfer fluid that travels from a circuit external to the radiator in the heating body.

5. The radiator according to claim 1, wherein the user control interface is configured to transmit to the external computer system, a signal representing the computing resource available in the radiator, wherein the availability depends on the user's setpoint.

6. The radiator according to claim 1, wherein the at least one processing circuit is connected to external peripherals and forms at least one of a micro-computer, a multimedia box, and a video game console.

7. The radiator according to claim 1, wherein the at least one processing circuit is provided outside the heating body, a part of the dissipating block directly contacting the heat transfer fluid by getting through a wall of the heating body.

8. A heating system comprising:

a plurality of single remote electric radiators, each radiator comprising an internal heat source and a heating body for performing heat transfer between the heat source of the single electric radiator and ambient air of the single electric radiator, the heat source is formed by at least one processing circuit whereon at least one computer processor is provided, the latter being connected to a dissipating block for evacuating heat in the heating body; and a user control interface configured for controlling the amount of energy dissipated by the heat source by controlling the at least one computer processor and the calculations executed by the at least one computer processor to obtain the amount of dissipated energy according to a user's setpoint, the user control interface is configured to transmit to an external computer system, a signal representing a computing resource available in the radiator depending on the user's setpoint, said at least one computer processor of the radiator executing calculations ordered by the external computer system which are sufficient in number and/or in complexity to provide the amount of calorific energy required by the user, a power supply and a communication interface enabling the external computer system to access said at least one computer processor, and at least one remote server connected to all the single electric radiators via an Internet type communication network to use the computing resource available in every single electric radiator.

* * * * *